(12) United States Patent
Shiono

(10) Patent No.: US 6,813,081 B2
(45) Date of Patent: Nov. 2, 2004

(54) ETALON AND METHOD FOR PRODUCING ETALON

(75) Inventor: Yoshiyuki Shiono, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/339,591

(22) Filed: Jan. 9, 2003

(65) Prior Publication Data

US 2003/0137735 A1 Jul. 24, 2003

(30) Foreign Application Priority Data

Jan. 10, 2002 (JP) ....................................... 2002-003132

(51) Int. Cl.$^7$ .............................................. G02B 27/00
(52) U.S. Cl. ...................... 359/577; 359/260; 356/454; 356/506
(58) Field of Search ................................ 359/260, 577, 359/584; 356/454, 506

(56) References Cited

U.S. PATENT DOCUMENTS

| | | | |
|---|---|---|---|
| 4,198,115 A | | 4/1980 | Kaminow |
| 4,898,641 A | * | 2/1990 | Ogihara et al. ............. 29/25.35 |
| 5,119,454 A | * | 6/1992 | McMahon .................... 385/49 |
| 5,153,771 A | * | 10/1992 | Link et al. ................... 359/286 |
| 5,310,448 A | * | 5/1994 | Bordui et al. ............. 423/594.8 |
| 6,043,940 A | | 3/2000 | Kamiyama et al. |
| 6,334,924 B1 | * | 1/2002 | Fukushima ................. 156/264 |
| 2001/0001944 A1 | | 5/2001 | Kitamura et al. |

FOREIGN PATENT DOCUMENTS

| | | |
|---|---|---|
| EP | 0 347 563 | 4/1989 |
| WO | 89/12120 | 12/1989 |
| WO | 99/44081 | 9/1999 |

OTHER PUBLICATIONS

G.Hernandez and K.Clark, "Electro–optic high–resolution Fabry–Perot spectrometer", Applied Optics, 33(10), pp. 1989–1992(1994).*
Kudo and Uehara, Basic Optics, $3^{rd}$ Edition, pp. 336–338, 1999, Gendai Kogakusha.
Oh, Optronics, No. 9, pp. 167–171, 2001.
Hernandez, et al., "Electro–optic high–resolution Fabry–Perot spectrometer" 2219 Applied Optics, vol. 33, No. 10, Apr. 1, 1994, Washington, US.
David Rust, "Etalon filters" 2417 Optical Engineering, vol. 33, No. 10, Oct., 1994, Bellingham, WA, US.

* cited by examiner

*Primary Examiner*—Leo Boutsikaris
(74) *Attorney, Agent, or Firm*—Hogan & Hartson, LLP

(57) ABSTRACT

An etalon has at least one transparent plate, wherein the transparent plate consists of lithium tantalate single crystal, an etalon has at least one transparent plate, wherein the transparent plate consists of lithium niobate single crystal and a method for producing an etalon, which includes at least growing a single crystal of lithium tantalate or lithium niobate by the Czochralski method, producing a transparent plate from the single crystal and producing an etalon from the transparent plate. There are provided etalons of thin type showing high thermal stability.

4 Claims, 2 Drawing Sheets

ETALON AND METHOD FOR PRODUCING ETALON

FIELD OF THE INVENTION

The present invention relates to an etalon used for an optical filter and so forth.

RELATED ART

Optical filters for taking lights of a specific wavelength region out of lights having continuously or discontinuously distributed wavelength characteristics are used in various fields. Among such optical filters, filters utilizing etalons have been widely used from old days for refractometry of gases, precision measurement of length and interference spectroscopes. Moreover, etalons have been used basically as interference filters for forming a series of sharp transmission peaks in the fields of other measurement instruments, research of light scattering, performance analysis of lasers, development of laser lines of narrower band, astronomy and so forth (for example, Kudo and Uehara, Basic Optics, 3rd edition, pp.336–338, 1999, Gendai Kogakusha; and Oh, Optronics, No. 9, pp.167–171, 2001).

The etalon means two of multiple reflection planes of which gap is fixed with a spacer made of invar or the like used in, for example, a Fabry-Perot interferometer. In particular, an etalon of this type is called a Fabry-Perot's etalon. Because it is difficult to maintain one reflection plane parallel to the other, the gap between the planes is fixed (Dictionary of Physics, Ed. by Editorial Committee of Dictionary of Physics, 1992, Baifukan).

There is also an etalon consisting one piece of transparent plate having two parallel surfaces so that the two surfaces of the transparent plate should serve as two of reflection planes. Such an etalon may be called a solid etalon. In such an etalon comprising one transparent plate, highly reflective coatings may be provided on the both surfaces of the transparent plate. The transparent plate of the etalon used in this case consists of optical glass, quartz glass, air or the like.

A transmission wavelength peak of light transmitting such an etalon as described above is observed when phases of light multiply reflected in the etalon become uniform at the outgoing plane of the etalon.

Meanwhile, demands for thinner etalons are increasing in various applications of etalons including measurement instruments. According to Kudo and Uehara, Basic Optics, 3rd edition, 1999, Gendai Kogakusha, transmission of the aforementioned solid etalon constituted with one transparent plate is given by the following equation.

$$T=1/(1+H \sin^2 \delta) \quad (1)$$

In the formula:

$$H=4R/(1-R)^2 \quad (2),$$

$$\delta=(\pi/\lambda)2nd \cos i - \phi \quad (3),$$

T: Transmission of etalon,
R: Reflectance of etalon,
$\lambda$: Wavelength,
n: Refractive index,
d: Thickness of transparent plate,
i: Angle of incidence,
$\phi$: Phase change due to reflection in etalon.

As for the characteristics of T, the maximum transmission is obtained at the time of $\sin \delta=0$, i.e., $\delta=m\pi$ (m=1, 2, 3 . . . ). In the case of the angle of incidence i=0, the phase change $\phi$ should be $\phi=0$. In this case, $\delta$ is defined by the following equation.

$$\delta=(\pi/\lambda)2nd \quad (4)$$

Realization of a thinner etalon, which is one of the objects of the present invention, is equivalent to making the thickness d of the transparent plate in the equation (4) smaller. Since $\delta$ is $\delta=m\pi$ and $\lambda$ is determined by the desired wavelength, the way of making the thickness d of the transparent plate smaller, i.e., obtaining thinner etalon, is using a larger n.

Although a thinner etalon can be attempted by producing the etalon by using a material exhibiting a larger refractive index as described above, high thermal stability must be simultaneously attained. This can be expressed that, in other words, the value of nd in the equation (4) must not vary as far as possible, even though temperature variation occurs. To realize this is another object of the present invention. There is a tendency that conventional material exhibiting a high refractive index show poor thermal stability, and thus smaller thickness of etalon and higher thermal stability could not be satisfied simultaneously.

SUMMARY OF THE INVENTION

As described above, an object to be achieved by the present invention is to provide an etalon consisting of a material that simultaneously satisfies the following two of requirements.

(1) Larger Refractive index n
(2) Smaller variation of product of refractive index n and thickness d of transparent plate due to temperature variation.

The present invention was accomplished in order to solve such a problem, and an object of the present invention is to provide a solid etalon consisting of one transparent plate, which has a small thickness and exhibits high thermal stability.

The present invention accomplished in order to achieve the aforementioned objects provides an etalon comprising at least one transparent plate, wherein the transparent plate consists of lithium tantalate single crystal.

According to the present invention, the transparent plate constituting the etalon is made from lithium tantalate single crystal as described above. Lithium tantalate has a refractive index of 2.13 for an ordinary ray at a wavelength of 1550 nm, which satisfies a requirement that the refractive index should be 2 or more, and exhibits high thermal stability as represented by peak variation of 2.5 pm/° C. for transmission wavelength due to temperature variation. Therefore, by preparing the transparent plate constituting the etalon from lithium tantalate single crystal, an etalon having a small thickness and exhibiting high thermal stability can be obtained.

The present invention also provides an etalon comprising at least one transparent plate, wherein the transparent plate consists of lithium niobate single crystal.

According to the present invention, the transparent plate constituting the etalon is also made from lithium niobate single crystal. Lithium niobate has a refractive index of 2.22 for an ordinary ray at a wavelength of 1550 nm, which satisfies the requirement that the refractive index should be 2 or more, and exhibits high thermal stability as represented by peak variation of 5 pm/° C. for transmission wavelength due to temperature variation. Therefore, by preparing the transparent plate constituting the etalon from such a material, an etalon having a small thickness and exhibiting high thermal stability can be obtained.

In the aforementioned etalons, an angle between a normal of light incidence and outgoing plane of the transparent plate and a c-axis of the single crystal constituting the transparent plate according to the representation for hexagonal system is preferably 0° to 10°.

As described above, both of lithium tantalate and lithium niobate satisfy the requirement of refractive index of 2 or more, and exhibit high thermal stability as represented by peak variation of less than 5 pm/° C. for transmission due to temperature variation. When the direction of the c-axis of the single crystal and forward direction of light (referred to as "optical axis" hereinafter) are parallel to each other, in other words, when the normal of light incidence and outgoing plane of the etalon conforms to the optical axis and an angle between the optical axis and the c-axis of lithium tantalate or lithium niobate is 0°, good thermal stability can be obtained.

However, when an etalon is used, the median wavelength may be controlled by providing a certain angle between the optical axis and the light incidence and outgoing plane. Because lithium tantalate and lithium niobate show anisotropy, a larger angle between the optical axis and the normal of the light incidence and outgoing plane causes a larger peak variation of transmission wavelength due to temperature variation. This is caused by influences of the temperature dependency of refractive index, different coefficients of thermal expansion for different crystal orientations and abnormal light refractive index. However, if the angle is 0° to 10°, desirably 0° to 5°, it is possible to maintain high temperature stability even in such a case. Therefore, in the etalons of the present invention, high temperature stability can be maintained by controlling the angle between the normal of light incidence and outgoing plane of the transparent plate and the c-axis of the single crystal constituting the transparent plate according to the representation for hexagonal system to be 0° to 10°.

In the etalons of the present invention, the transparent plate preferably consists of a single crystal grown by the Czochralski method.

If transparent plates that constitute etalons consist of a single crystal grown by the Czochralski method as described above, since single crystals of lithium tantalate and lithium niobate grown by the Czochralski method show good uniformity for refractive index and can be made as single crystals of a large diameter, the transparent plates are produced with good reproducibility and high yield, and thus etalons are produced at low cost.

The present invention also provides a method for producing an etalon, which comprises at least growing a single crystal of lithium tantalate or lithium niobate by the Czochralski method, producing a transparent plate from the single crystal and producing an etalon from the transparent plate.

If a single crystal of lithium tantalate or lithium niobate is grown by the Czochralski method as described above, a single crystal showing good uniformity for refractive index and having a large diameter can be obtained. Further, a single crystal of lithium tantalate or lithium niobate shows a high refractive index and high thermal stability. Therefore, if transparent plates are produced from such a single crystal and used for production of etalons, thin etalons showing high thermal stability can be produced with good reproducibility and high productivity.

In the aforementioned method, it is preferred that a single crystal having a diameter of 75 mm or more is grown, a single crystal plate having a diameter of 75 mm or more is produced from the single crystal, then the single crystal plate is divided into a plurality of transparent plates, and etalons are produced from the transparent plates.

In the processing of etalons, flatness and parallelism of surfaces affect the characteristics, and it is not rare that surface flatness of λ/40 and parallelism of 1 second are required. The method of the present invention is a method for producing etalons of such high precision in a large scale, and it enables production of etalons of high precision in a large scale by dividing a large single crystal plate having a diameter of 75 mm or more and showing good uniformity for refractive index into a plurality of transparent plates and producing the etalons from the transparent plates. In this case, by producing the etalons from a portion of the single crystal plate of a large diameter showing high flatness and high parallelism, etalons having still better characteristics can be produced with good reproducibility.

As explained above, thin etalons having high thermal stability can be produced with high productivity according to the present invention. In addition, the etalons of the present invention can be used for various purposes such as optical filters thanks to their superior characteristics.

PREFERRED EMBODIMENTS OF THE INVENTION

Hereafter, embodiments of the present invention will be explained in detail. However, the present invention is not limited to these.

The etalons of the present invention are etalons consisting of a lithium tantalate single crystal or a lithium niobate single crystal.

Figure 1:
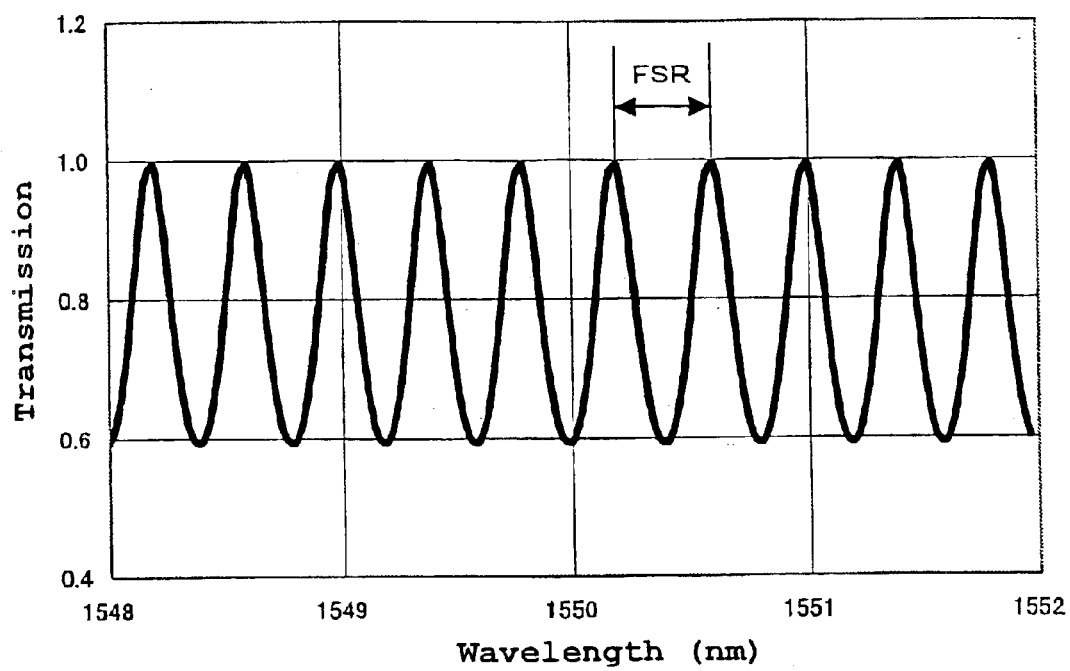
FIG. 1 shows wavelength transmission characteristics of an etalon according to the present invention.

Wavelength transmission characteristics of an etalon filter produced by using a lithium tantalate single crystal showing a refractive index for ordinary ray of 2.13 at a wavelength of 1550 nm so that FSR (Free Spectral range), which is a distance between transmission wavelength peaks, should become 50 GHz are shown in FIG. 1. The characteristics shown in FIG. 1 are those for an etalon in which the angle between the normal of light incidence and outgoing plane and the c-axis of the lithium tantalate single crystal according to the representation for hexagonal system is 0° and the normal of light incidence and outgoing plane and the optical axis are parallel to each other. The transparent plate constituting this etalon has a thickness of 1.408 mm.

In such a case, in order to obtain an etalon having the same characteristic that FSR is 50 GHz by using quartz glass, the transparent plate is required to have a thickness of 2.083 mm. Further, in case of an air etalon, assuming that an etalon can be produced with a refractive index of 1.00, a space corresponding to a transparent plate thickness of 3.000 mm is required in order to obtain FSR of 50 GHz. This indicates that the etalons of the present invention can realize a markedly thinner etalon.

Further, if an etalon is produced for obtaining FSR of 50 GHz by using a lithium niobate single crystal showing a refractive index for ordinary ray of 2.22 at a wavelength of 1550 nm with an angle between the normal of light incidence and outgoing plane and the c-axis of the lithium niobate single crystal of 0°, a transparent plate constituting the etalon has a thickness of 1.351 mm. Therefore, a markedly thinner etalon can be produced according to the present invention also in this case.

Peak variation of transmission wavelength due to temperature variation of these etalons is 2.5 pm/° C. for lithium tantalate or 5 pm/° C. for lithium niobate, and thus they have good thermal stability.

In an etalon produced by using lithium tantalate or lithium niobate so that the normal of light incidence and outgoing plane and the c-axis should be parallel to each other, it is of course possible to control the transmission peaks to be desired wavelengths by providing a certain angle between the normal of light incidence and outgoing plane and the optical axis. In this case, if the angle is 0° to 10°, it is possible to maintain the peak variation of the transmission wavelength due to temperature variation to be 2.5 pm/° C. for lithium tantalate or 5 pm/° C. for lithium niobate. Therefore, in the etalons of the present invention, high thermal stability can be maintained by defining the angle between the normal of light incidence and outgoing plane of the transparent plate and the c-axis of the single crystal constituting the transparent plate according to the representation for hexagonal system to be 0° to 10°.

The present invention also provides a method for producing etalons in a large scale with good reproducibility. Lithium tantalate and lithium niobate single crystals having a diameter of 1, 2, 3, 4, 5, 6 inches etc. are available. Availability of a large single crystal plate is a very important factor for the production of etalons with good reproducibility. If a large number of small plates are produced as original products, variation in thickness is caused for individual products, and therefore it is necessary to adjust the thickness of each of the large number of plates. However, if a large plate is produced and then divided into plates having a required size, it becomes unnecessary to adjust the thickness of each plate even after the large plate was cut into small plates having a required size, since the large plate has an extremely uniform thickness. Further, the demands for extremely high flatness and high parallelism can also be satisfied by using a portion of the large plate showing good flatness and parallelism.

In addition, these single crystals grown by the Czochralski method show very high uniformity for refractive index. In particular, lithium tantalate and lithium niobate single crystals having a diameter of 75 mm or more show extremely high uniformity for refractive index, and those showing a refractive index difference of 0.001 or less in each single crystal are available. Therefore, if a single crystal of lithium tantalate or lithium niobate having a diameter of 75 mm or more is produced, a single crystal plate having a diameter of 75 mm or more is produced from the single crystal, then the single crystal plate is divided into a plurality of transparent plates, and etalons are produced from the transparent plates, etalons can be produced in a large scale with good reproducibility.

A lithium tantalate single crystal is grown as follows, for example.

$Li_2CO_3$ and $Ta_2O_5$ raw material powders of high purity are weighed, mixed and charged into a crucible made of iridium, and the crucible is heated by high frequency dielectric heating method. After the raw material powder in the crucible was melted, a seed crystal having the c-axis along the direction of longer dimension is brought into contact with the melt, and the seed crystal is pulled. The heating temperature is slowly lowered so that the diameter should become larger, for example, it should become 75 mm. When the diameter becomes 75 mm, the heating temperature is controlled so that the diameter should be maintained. When the pulled length reaches, for example, 75 mm, the single crystal is separated from the melt and gradually cooled to room temperature.

As for growing of a lithium niobate single crystal, for example, $Li_2CO_3$ and $Nb_2O_5$ raw material powders of high purity are first weighed, mixed and charged into a platinum crucible, and the crucible is heated by high frequency dielectric heating method. Thereafter, a crystal can be grown in the same manner as that for the lithium tantalate single crystal described above.

Lithium tantalate and lithium niobate after the growth have a multiple domain structure, and therefore it must be made to have a single domain structure. They can be made to have a single domain structure by applying a direct current voltage to them at a temperature higher than the Curie temperature and cooling them with application of the voltage.

A large single crystal plate of lithium tantalate or lithium niobate can be obtained by using, for example, an inner diameter cutting machine. The angle between the normal of cut plane and the c-axis can be measured by using, for example, a cut surface analyzer produced by Rigaku international corporation, which utilizes X-ray diffraction. If the measured angle is not a predetermined angle, the angle of the cutting machine can be adjusted to obtain the predetermined angle.

The cut surface of the large single crystal plate is polished into a mirror surface by using a polishing machine. The both surfaces are subjected to mirror polishing by using abrasive grains, for example, colloidal silica, and the thickness of the plate is simultaneously adjusted to a predetermined thickness. Then, a plurality of transparent plates in a desired size are obtained by cutting and dividing the obtained large single crystal plate with an inner diameter slicer or the like, and etalons are produced from the transparent plates. If necessary, highly reflective coatings may be provided on the both surfaces to obtain a narrower band of transmission peak wavelength.

As described above, the etalons of the present invention are characterized by utilizing lithium tantalate or lithium niobate.

In addition, the etalons of the present invention have a small thickness and have high thermal stability, and they can be used for various purposes such as optical filters.

EXAMPLES

Hereafter, the present invention will be explained with reference to the following examples and comparative example. However, the present invention is not limited to these.

Example 1

[Production of Etalon with Lithium Tantalate (FSR: 50 GHz)]

$Li_2CO_3$ and $Ta_2O_5$ having a purity of 99.99% or more were weighed and mixed so that they should constitute a congruent composition. The raw material powder was charged into a crucible made of iridium, and the crucible was heated by high frequency dielectric heating method. After the raw material powder in the crucible was melted, a seed crystal (square pole of 5 mm×5 mm×50 mm) having the c-axis along the direction of longer dimension was brought into contact with the melt, and the seed crystal was pulled at a constant rate of 1 mm/h with rotation at a constant rate of 10 rpm. While the weight of the grown crystal was intermittently measured by using a load cell, the heating temperature was slowly lowered so that the diameter should become larger up to 75 mm. When the diameter became 75 mm, the heating temperature was controlled by using a computer so that the diameter should be maintained. When the pulled length reached 75 mm, the single crystal was separated from the melt and cooled to room temperature over 24 hours.

Since the grown lithium tantalate had a multiple domain structure, it was made to have a single domain structure. Electrodes were attached so that the voltage application direction should conform to the direction of c-axis, and the single crystal was heated to 650° C. in an electric furnace. Thereafter, it was cooled to room temperature over 24 hours, while it was applied with the voltage.

The single crystal was sliced by using an inner diameter slicer to obtain a single crystal plate of lithium tantalate having a diameter of 75 mm. The single crystal plate was obtained so that an angle between the normal of cutting plane and the c-axis should become 0°. This was equivalent to slicing in a plane parallel to the crystal face {001} that was perpendicular to the c-axis. This was secured by using X-ray diffraction peaks based on 006 reflection, and the angle between the {001} face and the cutting plane was measured. The diffraction peaks were measured by using a cut surface analyzer produced by Rigaku international corporation and Cu as an X-ray source at 2θ=39.3°. When the measured angle was not 0° C., the angle of the cutting machine was adjusted, and when the angle became 00, the single crystal was sliced in parallel with a thickness of 1.6 mm.

The obtained single crystal plate having a diameter of 75 mm was polished by a double side polisher using colloidal silica until the cut surfaces became mirror surfaces. Further, the polishing was performed until the thickness became 1.408 mm so as to correspond to the refractive index.

[Evaluation of Flatness and Parallelism]

Then, evaluation of flatness and parallelism was performed for the single crystal plate. The flatness was measured by using a grading incidence interferometer, Flatmaster 100, produced by Tropel Corp. The single crystal plate having a diameter of 75 mm, of which both surfaces were mirror polished, was fixed on a vacuum chuck, and interference fringes were measured. The analysis was performed for an area except for the peripheral portion having a width of 7.5 mm, and PLTIR for a 5 mm site was used as an evaluation value.

Figure 2:
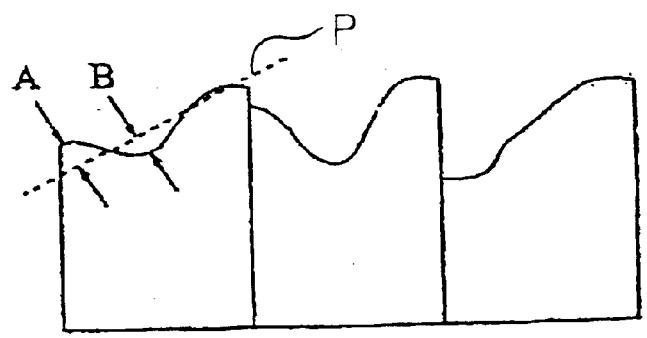
FIG. 2 shows an explanatory view for LTIR.

PLTIR is a value represented in terms of percentage obtained by dividing a number of sites showing an acceptable LTIR (Local Total Indicated Reading) value with respect to a predetermined acceptable LTIR standard value by the total number of analyzed sites, and the predetermined acceptable LTIR standard value was 0.03 μm. As shown in FIG. 2, LTIR represents, with a tree-point focal plane P as a standard, a distance from a highest point A existing above the plane to a lowest point B existing under the plane for each site.

The parallelism was measured by using an autocollimator. While the single crystal plate having a diameter of 75 mm, of which both surfaces were mirror polished, was rotated, a relative angle of the front surface and the back face was read in the scale, and the maximum value was used as an evaluation value.

As a result of the measurement, the flatness (PLTIR) was found to be 94% and the parallelism was found to be less than 1 second. Based on these results, it can be expected that, if etalons are produced by using transparent plates produced by dividing such a single crystal plate, etalons can be produced with good reproducibility.

Then, the single crystal plate having a diameter of 75 mm, of which both surfaces were mirror polished, was cut and divided by using an inner diameter slicer to produce square transparent plates having a side of 5 mm from a portion of the single crystal plate except for 10% of the peripheral portion, i.e., peripheral portion having a width of 7.5 mm, and etalons were produced from these transparent plates. The transparent plates constituting the etalons had a thickness of 1.408 mm adjusted so as to correspond to the refractive index.

[Evaluation of Peak Variation of Transmission Wavelength due to Temperature Variation]

Figure 3:
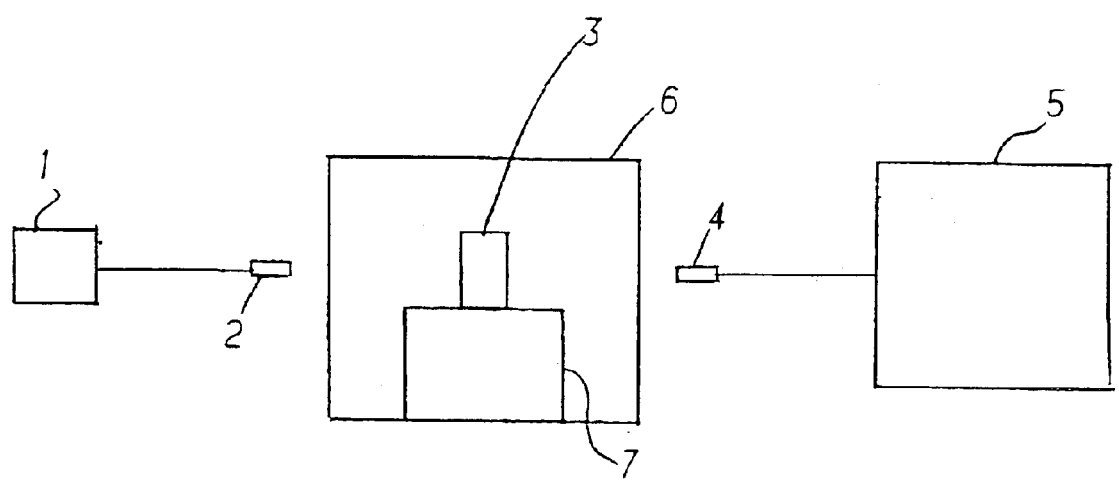
FIG. 3 shows a schematic view of an optical system for measuring wavelength transmission characteristics.

The peak variation due to temperature variation of the produced etalons was evaluated. The optical system for the measurement is shown in FIG. 3. Wavelength transmission characteristics of an etalon were obtained by allowing a light emitted from an LED light source 1 to pass through an optical fiber, outgo from a collimator 2, pass through an etalon 3 by spatial propagation, enter into a collimator 4, then pass through an optical fiber and enter into an optical spectrum analyzer 5 produced by Hewlett-Packard Company.

The etalon 3 was disposed in a thermal control unit 6, and peak wavelengths at 25° C. and 35° C. were read on the spectrum analyzer to calculate a peak variation per 1° C., which was used as an evaluation value.

A rotation stand 7 was disposed in the thermal control unit 6, and therefore it was also possible to read the peak wavelengths with changing the angle between the optical axis and the etalon. The peak variation magnitude for transmission wavelength due to temperature variation was also evaluated with changing the angle from 0° to 15°.

The peak variation magnitudes of the transmission wavelength due to temperature variation re shown in Table 1.

TABLE 1

| Angle (°) | Peak variation magnitude (pm/° C.) |
| --- | --- |
| 0 | 2.5 |
| 2 | 2.6 |
| 4 | 2.5 |
| 6 | 2.6 |
| 8 | 2.7 |
| 10 | 2.8 |
| 12 | 3.6 |
| 14 | 5.3 |

From the results shown in Table 1, it can be seen that the etalon of Example 1 showed a small peak varation magnitude of transmission wavelength due to temperature variation, and thus it had high thermal stability. In the angle range of 0° to 10°, in particular, the peak variation magnitude was less than 3 pm/° C., and thus it showed extremely high thermal stability. Based on these results, it can be seen that high thermal stability can be maintained by controlling the angle between the normal of light incidence and outgoing plane of the transparent plate and the c-axis of the single crystal constituting the transparent plate according to the representation for hexagonal system to be 0° to 100.

Example 2
[Production of Etalon with Lithium Niobate (FSR: 50 GHz)]

$Li_2CO_3$ and $Nb_2O_5$ having a purity of 99.99% or more were weighed and mixed so that they should constitute a congruent composition. The raw material powder was charged into a crucible made of platinum, and the crucible was heated by high frequency dielectric heating method. The following procedure was the same as that of Example 1. Further, the single crystal was made to have a single domain structure in the same manner as in Example 1 except that the temperature of the electric furnace was set to be 1180° C. Thereafter, a single crystal plate was prepared from the grown single crystal. Measurement of diffraction peaks was performed at 2θ=38.9°, and mirror polishing was performed in the same manner as in Example 1 except that it was performed until the thickness became 1.351 mm so as to correspond to the refractive index.

In the same manner as in Example 1, the single crystal plate was evaluated for flatness and parallelism. As a result, it was found that the flatness was 95% and the parallelism was 1 second or less. Based on these results, it can be expected that, if etalons are produced by using transparent plates produced by dividing such a single crystal plate, etalons can be produced with good reproducibility.

Then, an etalon filter was produced in the same manner as in Example 1. The thickness of the transparent plate constituting this etalon was adjusted so as to correspond to the refractive index and as a result, became 1.351 mm.

This etalon was evaluated for peak variation of transmission wavelength due to temperature variation in the same manner as in Example 1. The peak variation magnitude of the transmission wavelength due to temperature variation for various angles are shown in Table 2.

TABLE 2

| Angle (°) | Peak variation magnitude (pm/° C.) |
|---|---|
| 0 | 5.0 |
| 2 | 5.0 |
| 4 | 5.1 |
| 6 | 5.0 |
| 8 | 5.3 |
| 10 | 5.7 |
| 12 | 10.9 |
| 14 | 18.1 |

From the results shown in Table 2, it can be seen that the etalon of Example 2 showed a small peak variation magnitude of transmission wavelength due to temperature variation, and thus it had high thermal stability. In the angle range of 0° to 10°, in particular, the peak variation magnitude was less than 6 pm/° C., and thus it showed extremely high thermal stability. Based on these results, it can be seen that high thermal stability can be maintained by controlling the angle between the normal of light incidence and outgoing plane of the transparent plate and the c-axis of the single crystal constituting the transparent plate according to the representation for hexagonal system to be 0° to 10°.

Comparative Example
[Production of Etalon with Quartz Glass (FSR: 50 GHz)]

A quartz glass plate having a diameter of 50 mm and thickness of 2.083 mm was prepared. In the same manner as in Example 1, the plate was evaluated for flatness and parallelism. As a result, it was found that the flatness (PLTIR) was 83% and the parallelism was 3 seconds. Based on these results, it is expected that, if etalons are produced by using transparent plates produced by dividing such a quartz glass plate, etalons would be produced with poor reproducibility and thus show fluctuation of characteristics.

Then, the plate was cut and divided by using an inner diameter slicer to produce square transparent plates having a side of 5 mm, and etalon filters were produced from these transparent plates. The thickness of the transparent plates constituting the etalons was made to correspond to the refractive index, and as a result, it was 2.083 mm. This thickness was larger than those of the etalons of Examples 1 and 2 by 30% or more.

The present invention is not limited to the embodiments described above. The above-described embodiments are mere examples, and those having the substantially same configurations as that described in the appended claims and providing the similar functions and advantages are included in the scope of the present invention.

What is claimed is:

1. An etalon comprising at least one transparent plate, wherein the transparent plate consists of a lithium tantalate single crystal and an angle between a normal of light incident/outgoing plane of the transparent plate and a c-axis of the single crystal constituting the transparent plate according to the representation for hexagonal system is greater than 0° but not greater than 10°.

2. An etalon comprising at least one transparent plate, wherein the transparent plate consists of lithium niobate single crystal and an angle between a normal of a light incident/outgoing plane of the transparent plate and a c-axis of the single crystal constituting the transparent plate according to the representation for hexagonal system is greater than 0° but not greater than 10°.

3. The etalon according to claim 1, wherein the transparent plate consists of a single crystal grown by the Czochralski method.

4. The etalon according to claim 2, wherein the transparent plate consists of a single crystal grown by the Czochralski method.

* * * * *